_United States Patent_ [19]

Anschel et al.

[11] Patent Number: 5,631,498

[45] Date of Patent: May 20, 1997

[54] THIN FILM METALLIZATION PROCESS FOR IMPROVED METAL TO SUBSTRATE ADHESION

[75] Inventors: Morris Anschel; Douglas W. Ormond, both of Wappingers Falls; Carl P. Hayunga, Poughkeepsie, all of N.Y.

[73] Assignee: International Business Machines Corporation, Armonk, N.Y.

[21] Appl. No.: 444,667

[22] Filed: May 19, 1995

Related U.S. Application Data

[62] Division of Ser. No. 194,620, Feb. 10, 1994, which is a continuation of Ser. No. 893,860, Jun. 4, 1992, abandoned.

[51] Int. Cl.$^6$ .............................. H01L 23/48; H01L 29/40
[52] U.S. Cl. .......................... 257/690; 257/758; 257/759; 257/753; 257/762; 257/766
[58] Field of Search ................................... 257/690, 697, 257/758, 750, 730, 754, 753, 759, 792, 762, 766, 700

[56] References Cited

U.S. PATENT DOCUMENTS

| | | | |
|---|---|---|---|
| 4,078,096 | 3/1978 | Redmond et al. | 427/98 |
| 4,221,047 | 9/1980 | Narken et al. | 257/697 |
| 4,338,621 | 7/1982 | Braun | 257/697 |
| 4,351,704 | 9/1982 | Kurihara | 204/15 |
| 4,382,101 | 5/1983 | Polak | 427/40 |
| 4,386,116 | 5/1983 | Nair et al. | 427/99 |
| 4,575,475 | 3/1986 | Nakayama et al. | 428/480 |
| 4,582,564 | 4/1986 | Shanefield et al. | |
| 4,617,730 | 10/1986 | Geldermans et al. | 257/697 |
| 4,720,401 | 1/1988 | Ho et al. | 427/250 |
| 4,765,860 | 8/1988 | Ueno et al. | 427/40 |
| 4,816,341 | 3/1989 | Nakayama et al. | 628/458 |
| 4,826,720 | 5/1989 | Wade | 428/209 |
| 4,886,681 | 12/1989 | Clabes et al. | 427/38 |
| 4,975,327 | 12/1990 | Somarisi et al. | 428/409 |
| 5,019,210 | 5/1991 | Chou et al. | 427/299 |
| 5,036,383 | 7/1991 | Mori | 257/754 |
| 5,103,292 | 4/1992 | Mahulikar | 257/697 |

OTHER PUBLICATIONS

"Flash Evaporation for High Purity Thin Films"; D.J. Mikalsen et al.; IBM Technical Disclosure Bulletin; vol. 30, No. 3, Aug. 1987; pp. 1312–1313.
"Super–Adhesive Bonding of Metal to Polyimide"; A.A. Efros et al.; IBM Technical Disclosure Bulletin; vol. 30, No. 7, Dec. 1987; pp. 227–228.
IBM Technical Disclosure Bulletin, "AG Mettalurgy System for Integrated Circuit Devices", Mutter et al. vol. 13 No. 2 7/70 252/258.

_Primary Examiner_—Mahshid D. Saadat
_Assistant Examiner_—Jhihan B. Clark
_Attorney, Agent, or Firm_—Whitham, Curtis, Whitham & McGinn; Ira D. Blecker

[57] ABSTRACT

A metallization layer is formed on a substrate with improved adhesion thereto by performing the deposition at an elevated temperature which favors the formation of chemical bonds of the metal to the substrate as well as clusters of metal embedded within the substrate and contiguous with the metallization layer. In polymer substrates the chemical bond is made to carbonyl functional groups such as ketones or aldehydes. The adhesion is enhanced by the removal of moisture from the surface of the substrate at the elevated temperatures employed. A high degree of adhesion is also obtained through the deposition of a mixture of metals including chromium and copper which initially has a high chromium to copper ratio which is decreased during the deposition process. Completion of the process is determined by the reaching of a final desired chromium to copper ratio as observed by optical emission spectroscopy. The process can be carried out on a continuous basis by the use of a multi-chamber vacuum sputtering system.

3 Claims, 5 Drawing Sheets

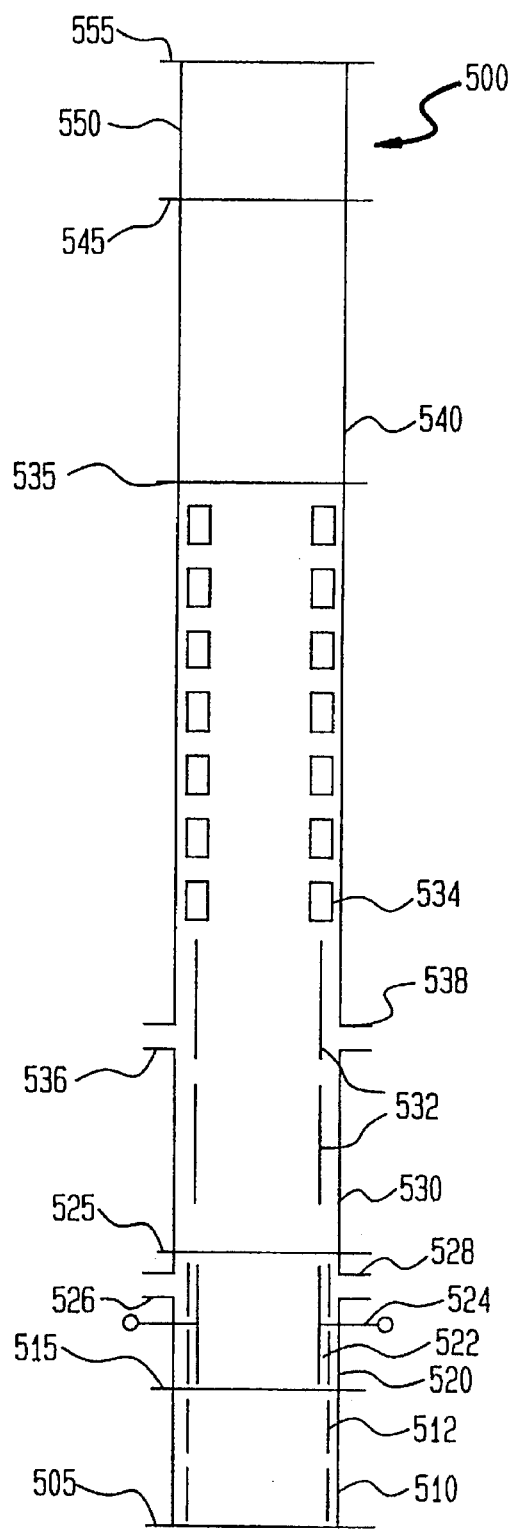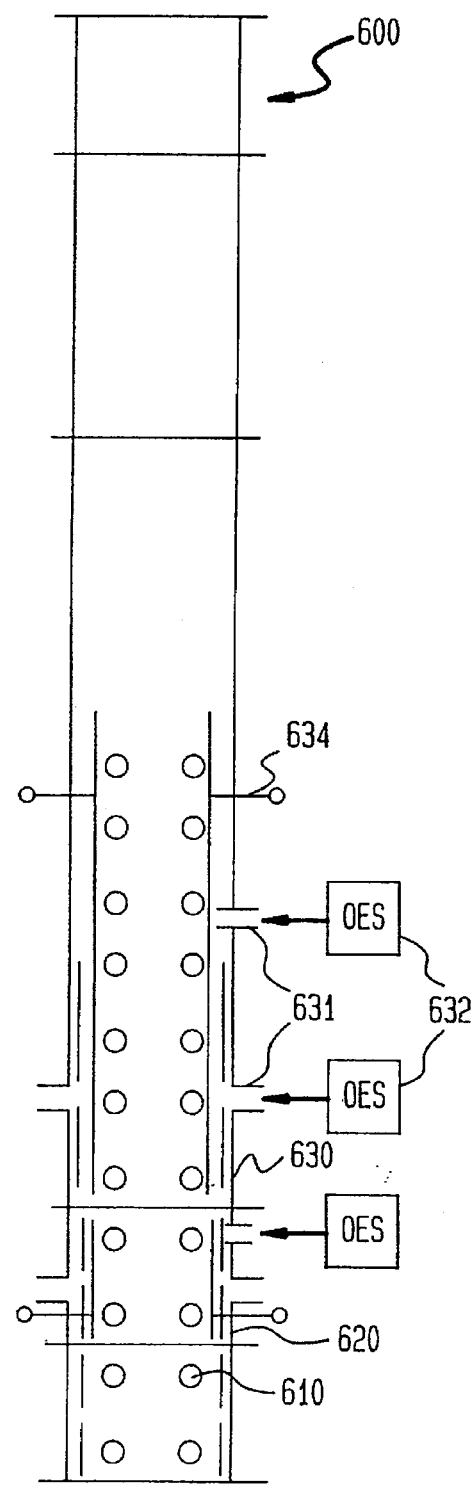

THIN FILM METALLIZATION PROCESS FOR IMPROVED METAL TO SUBSTRATE ADHESION

CROSS REFERENCE TO RELATED APPLICATION

This application is a division of application Ser. No. 08/194,620 filed Feb. 10, 1994, which is a continuation of application Ser. No. 07/893,860, filed Jun. 4, 1992 now abandoned.

BACKGROUND OF THE INVENTION

1. Field of the Invention

The present invention generally relates to the manufacture of electronic components and, more particularly, to the improvement of adhesion between a metallization layer and an underlying polymer insulating layer included therein.

2. Description of the Prior Art

As functions demanded from integrated circuits has increased in recent years, it has become the practice to increase production yields of electronic devices through the use of packaging of integrated circuits in modules. So-called multi-layer modules (MLM), including structures commonly referred to as multi-layer ceramic (MLC) modules, are exemplary of such packaging types. These modules allow the inclusion of a plurality of integrated circuit chips within the same module and provide for a potentially highly complex interconnection wiring pattern between the chips. These structures also allow the inclusion of chips formed by different technologies which may be mutually exclusive, thereby allowing for increased flexibility of circuit design.

In order to make desired contacts to the chips included therein, such modular structures usually include so-called distribution wiring which accommodates the extremely small regions on a chip where desired connections are to be made. The feature sizes encountered in distribution wiring is many times smaller and densities many times greater than in the interconnection wiring used in the remainder of the module. The distribution wiring will, therefore, typically be formed from a plurality of layers of polymer (e.g. polyimide) insulator having selected areas coated with a metal. Connections between layers are achieved by depositing metal in small holes, called vias, in the respective polyimide layers.

At the present state of the art, it is considered cost-effective to test and repair such modules at particular points during the course of manufacture. One such type of repair can include the removal and replacement of one or more of the chips of the module. As is known in the art, the connection from the distribution wiring to a chip is accomplished by the use of a pad termination or formation of the distribution wiring and the flow of solder between that pad and a corresponding pad on the chip. Solder is often provided as a preform, such as in the so-called controlled collapse chip connection type of pad (hereinafter referred to as simply a C4 pad), and the preform is reflowed to form the connection. Therefore, during either soldering or desoldering of a chip, substantial heat and mechanical stress is applied to such a connection pad. Since the module or at least the chip is heated substantially uniformly during such a process, the remainder of the metallization is subjected to heat stress and to some degree of mechanical stress due to the differential dimensional changes with temperature of the metallization and the polymer insulator. Accordingly, since soldering and desoldering may be required a number of times adhesion between the metallization and the polymer insulator becomes extremely important if the production of further defects in the metallization is to be avoided.

It should also be noted that pads and other portions of the metallization pattern will traverse metal-filled vias, as alluded to above. At the point where the metallization overlies such a structure, also commonly referred to as a connection stud, metal-to-metal bonding will be provided or occur inherently by virtue of the particular deposition process used. This bonding effectively enhances the adherence of the metallization to the substrate although the actual adherence to the polymer is not, itself, enhanced. However, in many cases of pattern design, it is not possible or desirable to form such a stud beneath all pads or even at a sufficient number of points to significantly reduce the tendency toward separation of the metallization from the underlying polymer material. Such regions which are not formed over such studs are referred to as being "unanchored". Accordingly, the tendency toward separation of metallization from an underlying polymer over the course of numerous applications of thermal and/or mechanical stress, as are typically encountered during the manufacture, including testing and repair, of such modules, cannot be adequately controlled by the mere multiplication of such studs.

While the design of modular packages generally includes provision for repair of broken conductors, it must be appreciated that loss of adhesion may not immediately result in the breaking of a connection. In fact, such a loss of adhesion may not be initially detectable by electrical testing at all but may represent a latent defect which will break and cause malfunctioning of the module after it is completed and put in service. When a loss of adhesion occurs, normal thermal cycling of the module during normal operation may cause flexing of the connection sufficient to cause metal fatigue and fracture of a conductor if the conductor is not mechanically supported by adhesion to a polymer layer. In such a case, the manufacture is likely to have at least progressed beyond the point where repair is possible, thus, at least, decreasing manufacturing yields of the modules and increasing economic cost. It is also likely that economic cost will be further increased if failure occurs during field operation since testing and diagnosis of the entire unit in which the module is installed will often be required in addition to the economic cost of down-time of the unit.

It is to be understood that the problem of adhesion of metal to polymer dielectrics, and polyimide dielectrics in particular, is not unique to the manufacture of multi-layer electronic circuit modules but may be encountered in other technologies involved in other types of electronic elements such as the formation of capacitors or even other technologies entirely unrelated to the fabrication of electrical devices. However, since the problems of loss of adhesion are of substantial economic importance at present in the fabrication of multi-layer modules, the present disclosure will be directed thereto in order to convey an understanding of the meritorious effects of the invention in comparison with the prior art.

SUMMARY OF THE INVENTION

It is therefore an object of the present invention to provide a process of adhering a film of metal to a polymer resulting in an increased degree of adhesion therebetween.

It is another object of the invention to provide a process of applying metallization to a surface of a polymer which results in chemical bonding between the metal and the polymer.

It is a further object of the invention to provide an electrode composition having a characteristic of improved adherence to a polymer surface.

It is yet another object of the invention to provide improved avoidance of latent defects and to increase manufacturing yields of modular electronics packages.

It is a yet further object of the present invention to provide a method and apparatus for depositing a metal layer on a polymer while simultaneously forming a strong bond between the metal and the polymer.

In order to accomplish these and other objects of the invention, a metallization layer on a surface of a substrate is provided including clusters of metal formed within said substrate and contiguous with said metallization layer on said surface of said substrate.

In accordance with another aspect of the invention, a metallization layer is provided on a surface of a substrate by a process including the steps of activating said surface of said substrate, heating said substrate to a temperature in the range of 230° C. to 280° C., and depositing a mixture of metals on said surface of said substrate. In accordance with a further aspect of the invention, a method is provided including the steps of activating a surface of a substrate, heating said substrate to a temperature in the range of 230° C. to 280° C., and depositing a mixture of metals on said surface of said substrate.

BRIEF DESCRIPTION OF THE DRAWINGS

The foregoing and other objects, aspects and advantages will be better understood from the following detailed description of a preferred embodiment of the invention with reference to the drawings, in which:

FIG. 5 is a schematic illustration of a multi-chamber sputtering vacuum system in accordance with the invention, FIG. 6 is a multi-chamber vacuum sputtering system in accordance with a preferred embodiment of the invention.

DETAILED DESCRIPTION OF A PREFERRED EMBODIMENT OF THE INVENTION

Figure 1:
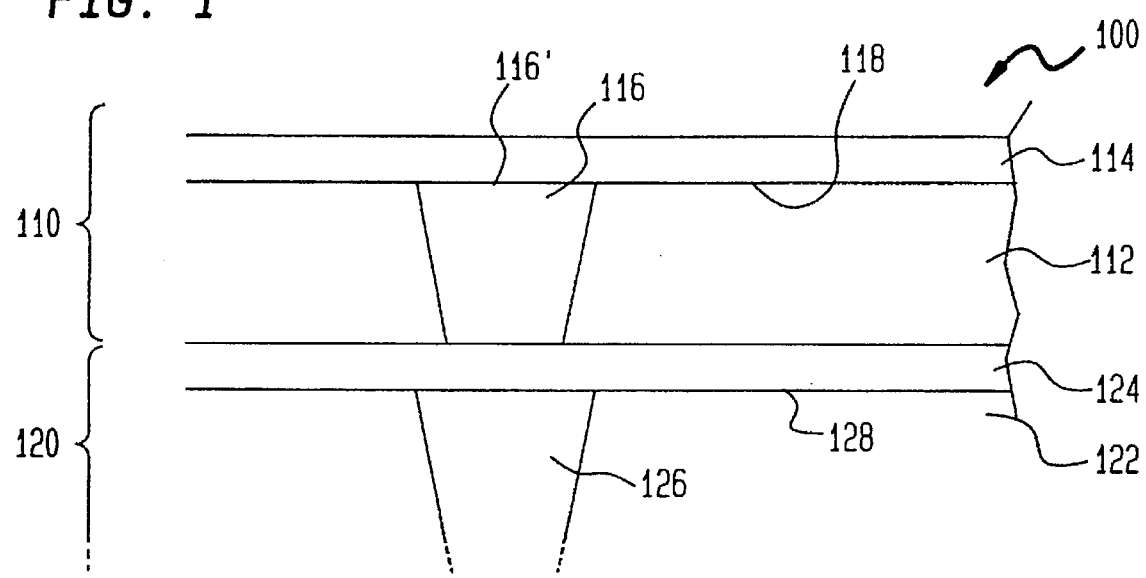
FIG. 1 is a cross-sectional view of a portion of a polymer layer with metallization formed thereon which overlies a copper stud.

Referring now to the drawings, and more particularly to FIG. 1, there is shown a portion of the distribution wiring arrangement 100 of a multi-layer module. Only the uppermost layer 110 and a portion of an underlying layer 120 is shown. Other lower layers would appear similar to those illustrated. The uppermost layer 110 includes a polymer (e.g. polyimide) layer 112, metallization layer 114 and connection stud 116. Similarly, layer 120 includes a similar polymer layer 122, metallization layer 124 and connection stud 126. Metallization layers 124 will typically be patterned and polymer deposited between the conductors of the pattern either separately or during lamination with other layers. Studs such as 126 may or may not be present at the same or different locations at surface 128, depending on the wiring connections desired for the number of layers used. However, some such connection studs will be present in every layer in order to eventually form connections to the interconnection portion of the circuitry provided in the module.

Figure 3:
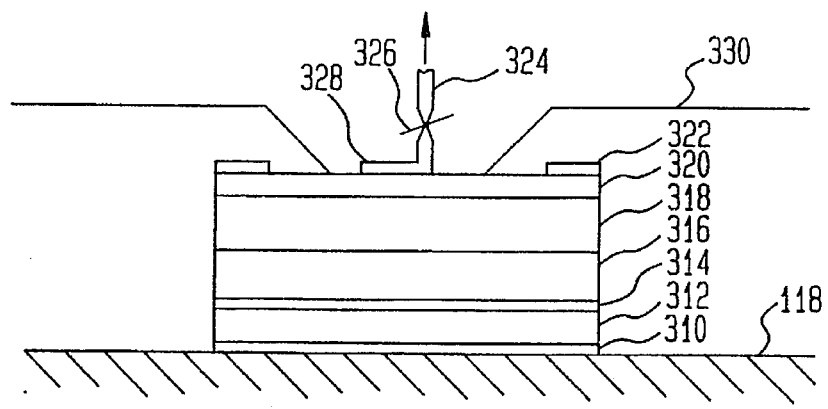
FIG. 3 is a cross-sectional view of a metallized pad region having the structure of a so-called redundant metal layering arrangement, including a tensile strength test wire bonded thereto, on a polymer surface and surrounded and partially overlaid by polymer material.

Studs 116, 126 are usually formed of copper by any of a number of possible metal deposition processes. Metallization layers 114, 124 may include a plurality of layers of different materials which may also be deposited by any of several processes. An exemplary layered metallization structure, referred to as a redundant metal structure since it is defect-tolerant, is shown in FIG. 3. Layer 310 is preferably chromium (of about 200 Å thickness) for adhesion, relatively thick (about 2 μm) layer 312 is of copper for high conductivity, layer 314 is of chromium (again of about 200 Å thickness) for adhesion to redundant copper layer 316 as well as to polymer surface 118 if a defect is formed in layers 310 and 312. Layer 318 is preferably of nickel to provide a diffusion barrier between copper layer 316 and thin gold layer 320 which also enhances conductivity. Layer 322 is of chromium for protection of the gold layer 320.

Returning now to FIG. 1, the metallization layer (e.g. 114) is thus bonded to the connection stud (e.g. 116) as the layer is formed and thus securely adhered thereto at the upper surface 116' of stud 116. Therefore, the remainder of the lower surface of the metallization layer 114 forming an interface 118 between the metal and the polymer layer 112 is critical for maximizing adhesion of the metal layer, especially in regions other than those above connection studs. Chromium is used to maximize metal/polymer adhesion in this region, at least as an initial layer portion of metal layer 114 among other possible metal choices.

Figure 2:
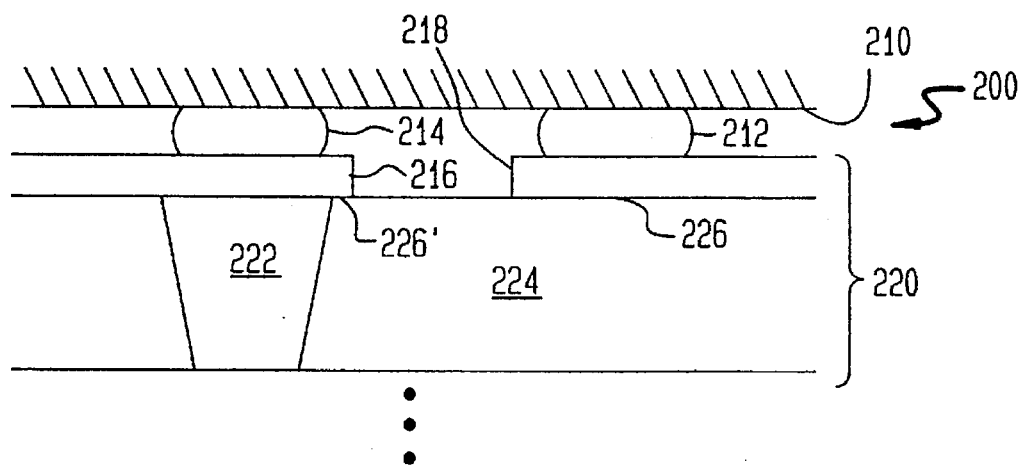
FIG. 2 illustrates, in cross-section, the structures of anchored and unanchored pads.

However, the mere use of chromium, although generally considered to be optimal among other possible metals, has not produced a degree of adhesion which could withstand as many as 10–12 applications of thermal and/or mechanical stress as might be encountered during module defect repair during fabrication, as discussed above. Specifically and with reference to FIG. 2, the uppermost distribution wiring layer 220 is shown formed into an assembly 200 with the lower surface 210 of an exemplary chip. Connections to the chip are made by connection pads 216 and 218 and solder preforms 212 and 214 (e.g. together, forming pads, generally referred to as C4 pads). In this illustration, pad 216 is anchored by connection stud 222 while pad 218 is simply adhered to polymer 224.

It can be seen that in order to remove the chip from its attachment to pads 216, 218, that the solder preforms must be softened by heat and the chip lifted away from the underlying distribution wiring. Therefore, when this operation is required during repair, a combination of thermal and tensile stress is applied to the interfaces 226, 226' between the metal and the polymer. Due to the metal bonding between pad 216 and stud 222, the adhesion of pad 216 is more likely to survive repeated applications of such thermal and mechanical stress than pad 218 unless adhesion at interface 226 between pad 218 and polymer 224 can be made comparable to a metal-to-metal bond. Such a degree of adhesion has not been heretofore available in the art.

In order to increase the degree of adhesion at interface 226, it has been found, by the inventors, that a chemical bond between a metal (e.g. chromium) and the surface of a polymer (e.g. polyimide) can be formed during the deposition of the metal on the polymer under certain conditions. Specifically, the inventors herein have found that low moisture content of the polymer is critical to the formation of chemical bonds between the metal and the polymer. Further, particular parameters of a preparatory surface activation step, such as by a etching/cleaning at radio frequencies, ion bombardment (primarily with argon and other species such as argon and nitrogen) and ion milling to provide a modified polymer surface, are also critical to the formation of chemical bonds between the metal and the polymer. Secondarily, net adhesion (e.g. the net force required to separate the metal from the polymer) is enhanced with stress relief in the polymer and the metal in the vicinity of the interface 226.

At least one of the chemical bonding reactions involved in the formation of a chemical bond between the metal and the polymer is believed to be a reaction between chromium and oxygen of a polyimide carbonyl group of the polymer, yielding a stable covalent bond. A similar reaction is possible in other polymers which have a carbon-oxygen double bond, such as in ketones and aldehydes, which will function as a carbonyl group for purposes of the chromium-oxygen carbonyl (Cr—O—C) reaction. This interdiffusion and compound interface reaction is favored at temperatures between 230° C. and 280° C. At lower surface temperatures, the formation of chromium oxide is favored and thus no chromium-oxygen-carbonyl bonding to the polyimide is possible since the chromium d-orbitals are filled by the reaction with oxygen, alone. The range of temperatures favoring the Cr—O—C reaction has also been found to be sufficient for bake-out of moisture from the surface layers of the polymer in approximately 15–45 minutes, thus adding little to the overall process time and maintaining the throughput of the prior deposition process even when little or no bonding of the metal to the polymer was achieved. This temperature for moisture bake-out compares with temperatures of 100° C. to 150° C. generally employed for the purpose. Further, the elevated temperature during metal deposition provides a high degree of stress relief by effectively annealing the metal and allowing slight reflow of the polymer if stresses are present therein.

It has also been found by the inventors that reduced formation of chemical bonds between the metal and the polymer occurs at either reduced or increased power levels, temperatures and etch times utilized during a preparatory surface activation process. While it is common in the art to prepare a surface for material deposition by etching and other processes noted above, this surface preparation process can also limit interaction of a metal with a polymer. The reason for this is that high etch rates and/or long etch times tend to lower the surface concentrations of carbonyl groups involved in the reaction described above.

Figure 4:
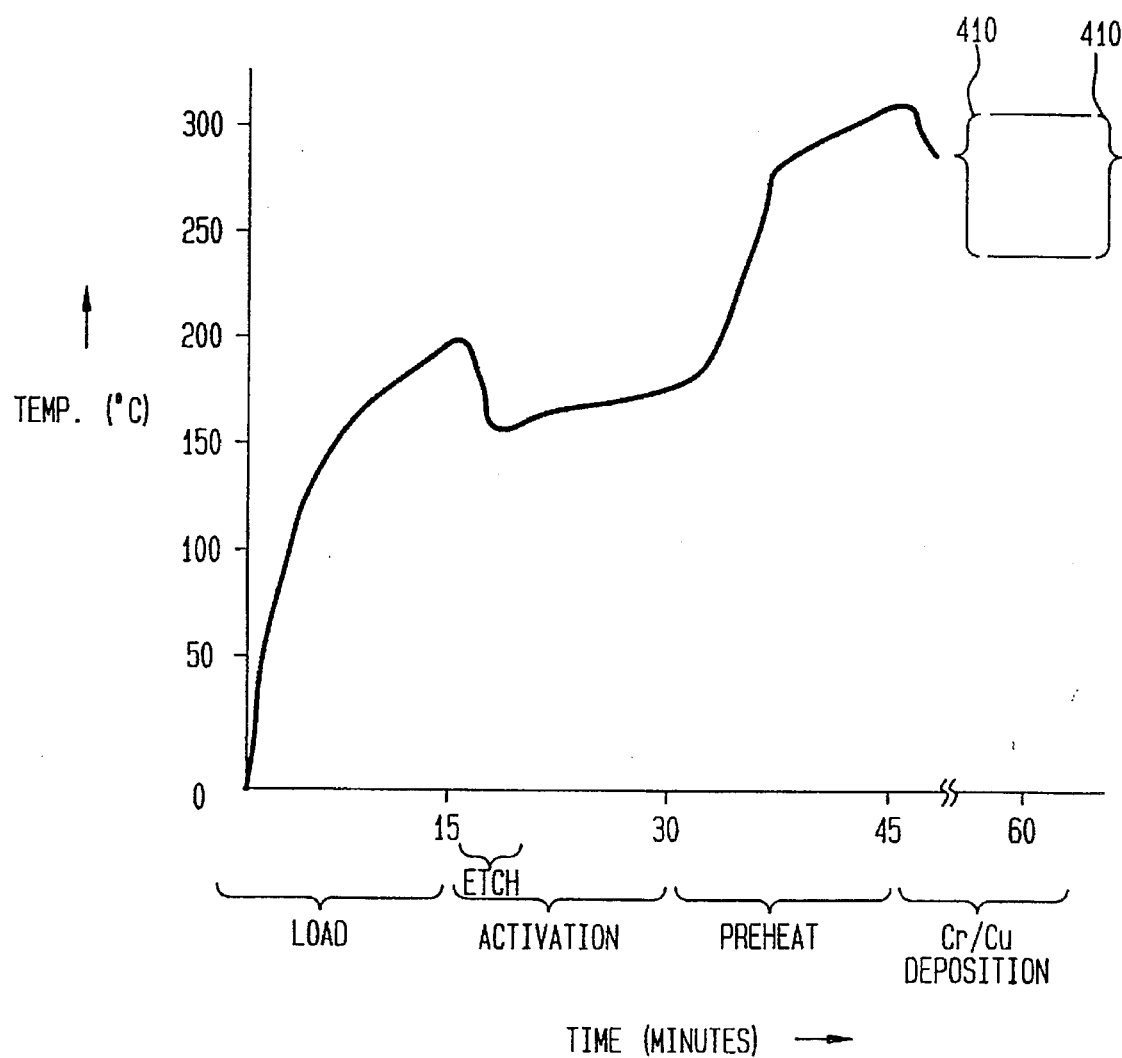
FIG. 4 is a graph of the preferred temperature profile over time of the process in accordance with the invention.

The apparent dependency of bonding on the parameters of the surface activation process is largely based on empirical evidence using a test configuration as illustrated in FIG. 3. Specifically, a pad was formed including a redundant metal structure, discussed above, using the process of the invention and the specific time/temperature profile shown graphically in FIG. 4 in a multi-chamber sputter vacuum system as shown schematically in FIG. 5. The load cycle includes a bake-out period during which the substrate temperature is raised to approximately 200° C. The temperature was somewhat reduced during an etch/surface activation interval after which the temperature is slowly raised to approximately 300° C. Then a preheating cycle is carried out to achieve a temperature between 230° C. and 280° C. which favors the chromium-oxygen-carbonyl bonding reaction described above, at which temperature metal deposition by sputtering was performed.

For a standard pull test of metal adhesion strength, referred to as a manufacturing use test, an end portion 328 of a 2 mil diameter gold wire 324 was bonded to the surface 330 of the redundant metal pad and tension applied thereto. The diameter of the wire provides a standardized adhesion strength if the wire is broken (e.g. at 326) before the pad is pulled away from the polymer. If the wire breaks and leaves bonded portion 328, called a nugget, attached to the pad, it is considered that sufficient bonding has been achieved to develop adhesion which will withstand repeated thermal and/or mechanical stress of the degree encountered during module repairs. However, if a failure occurs between the metal and the polymer at a force less than that required to break the wire (approximately 27 grams) adhesion is considered to be of a significantly low value which will adversely affect the reliability of the product.

The etching method applied was an RF (e.g. plasma) etch using Argon gas at $3 \times 10^{-3}$ Torr. Two groups of pads were formed by processes which differed only in etch time and RF power applied. For the first group of 105 pads which were formed receiving a two minute etch at an applied power of 0.1 W/cm$^2$=0.5 KW, nuggets were produced (e.g. the pad bond strength exceeded the tensile strength of the gold wire) in 100 percent of the samples. This success rate suggests that a higher power density value could be effectively used. In the second group of 123 pads formed receiving a five minute etch at an applied power of 2.0 KW or 0.4 W/cm$^2$, nuggets were produced on 98 percent of the samples, thereby suggesting that the latter group represents an approximate upper limit on the degree of etch to be employed in the practice of the invention. Of course, other etching processes may be used and the efficiency of the power utilization in the etching process may vary. However, for the particular apparatus on which this experiment was carried out, a 1 KW input power level corresponds to an etching power density of 0.2 Watts/cm$^2$. Accordingly, preferred limits on the etching time and power density are two to five minutes at 0.2 to 0.4 W/cm$^2$ (e.g. 1 to 2 KW) at an argon gas pressure of $3 \times 10^3$ Torr and a temperature profile corresponding to FIG. 4. A control group of pads formed after a bake-out for a similar period but with bake-out temperature reduced by 100° C. showed a very high percentage of Full Lift-Offs of Pads (FLOPS).

Referring now to FIG. 5, a sputtering chamber 500 in accordance with the present invention is shown. Sputtering chamber 500 is preferably a series of chambers 510, 520, 530, 540, 550 separated by partitions 515, 525, 535, 545 therebetween to allow different temperatures and atmospheres to be maintained in the respective chambers. End closures 505, 555 are also provided to seal the sputtering chamber 500 from the ambient atmosphere. The overall sputtering chamber 500 is also preferably provided with a carrier capable of continuous or intermittent movement to transport the substrates to be sputtered through each process and to assure appropriate timing of exposure to each process.

A load chamber 510 is provided to receive polymer substrates or layered groups of such substrates, either before or after attachment to connection wiring structures. The substrates are preferably placed in metal carriers which are one of a plurality of devices which may be placed in the sputtering chamber and which are collectively referred to as fixtures or tooling. Load chamber 510 includes heaters 512 which preheat the substrates to a temperature of about 200°

C. to 220° C. The period of time the substrates are at about 200° C. or above is on the order of 15 minutes in the load chamber 510 and an additional 15 minutes in each of the etch chamber and the sputter chamber prior to the effective commencement of metal deposition in accordance with the invention, indicated by brackets 410 of FIG. 4, to achieve sufficient bake-out of moisture from the surface of the substrate. It should be noted that the load chamber 510 can also be closed and partial vacuum conditions applied in the same manner as other chambers of the vacuum system of FIG. 5. The same provision is also made in the vacuum system of FIG. 6.

Etch chamber 520 is similar to load chamber 510 and includes heaters 522 which are preferably independently controllable to maintain a different, lower temperature from adjacent chambers. Etch chamber 520 further includes an arrangement 524, depicted here as electrodes, for coupling relatively high power energy at radio frequencies to generate a plasma from the atmosphere in the etch chamber. It is to be understood, however, that other arrangements such as coils or waveguides could be used to introduce such energy into the chamber. Alternatively, as pointed out above, other processes such as ion beam milling and ion bombardment could also be employed to carry out the invention. Also, etch chamber 520 includes inlet and outlet ducts 526 and 528 for supplying desired gas or gases, preferably argon, into the etch chamber and maintaining a desired pressure thereof, here preferably about $3 \times 10^{-3}$ Torr, during the RF etching/cleaning surface activation process.

Deposition chamber 530, here preferably arranged for sputtering, includes at least heaters 532 to increase the substrate temperatures from the temperature at which the etch is performed. Other heaters may be provided as necessary. However, since the Cr—O—C reaction described above will be favored over a fairly broad temperature range (230° C. to 280° C.), with proper insulation preferably provided by the partial vacuum in the deposition chamber, it is possible to merely heat the substrates to an initial temperature near the upper end of the preferred range and allow the substrates to cool slightly during material deposition to a temperature near the lower end of the range at the time the first or bottom chromium deposition is complete.

Material or materials to be deposited are arranged to the sides of the substrate path through the chamber as shown at 534 in a manner well-known in the art and of no particular criticality to the practice of the present invention. This material can also be arranged as one or more sputtering targets by forming the materials as a cathode. For production of the preferred redundant metal type of deposition shown in FIG. 3, however, the materials are arranged in the order of desired layers to be deposited. The relative numbers of targets correspond to the relative thicknesses of layers desired. Therefore, to produce a redundant metal structure, the first and last pairs of targets would be chromium and intervening targets would be copper. Ducts 536 and 538 are provided for maintaining desired composition and pressure of the atmosphere during the metal deposition process and can also be used to purge and renew the atmosphere either intermittently or continuously to prevent build-up of contaminants therein.

Cooling chamber 540 does not necessarily include heaters but is merely insulated to provide very slow cooling such that stress relief in the substrate and deposited metal, achieved through the high temperature at which metal deposition is performed, is maintained. It is also a preferred enhancement to this process to maintain a partial vacuum of under 200 Torr of nitrogen or argon gas. This slow cooling process provides annealing of stress and defects by metal recrystallization and grain growth. The partial vacuum reduces the cooling rate and also reduces the possibility of contamination by foreign particles or surface reaction products. Very slow cooling is especially important since the substrate has a lower thermal expansion coefficient than the metal which tends to cause tension in the metal during cooling of the assembly. Partition 545 prevents circulation of ambient atmosphere which could disrupt the cooling process. Finally, unload chamber 550 is provided to allow completion of the cooling process in a controlled partial vacuum and access to the metallized substrates when the processing is complete.

It is to be understood that sputtering chamber 500 is arranged as described above to achieve metal deposition by sputtering. Other arrangements, and particularly changes in the deposition chamber and etch chamber, could be made to accommodate other processes, such as those alternative processes noted above. An example of a presently preferred modification is shown in FIG. 6 which is substantially identical to FIG. 5 except for the deposition chamber.

It has also been found by the inventors that simultaneous etch and deposition processes, referred to as an etching/redeposition process (as opposed to the etch/cleaning process of performed as described above using the vacuum system of FIG. 5), of a mixture of metals, preferably copper or possibly nickel and chromium, produces even greater adhesion and freedom from defects than the redundant metal structure illustrated in FIG. 3. To achieve this type of metal deposition, bodies of "sacrificial material" 610 are loaded onto carriers with the substrates to be transported through chamber 600. This sacrificial material should contain metals in proportions based on the final relative concentrations desired in the deposited mixture. These sacrificial materials could be coated as a mixture onto a fixture, such as a substrate holder, or other device within the sputter chamber or sputter targets for coating. It is also possible to alter the relative concentrations of materials during the etch/redeposition process by altering the concentrations at different depths within the bodies of sacrificial material, such as by providing one or more coating layers of material having differing material proportions or the relative surface area of each material which is exposed to the etching plasma by shaping of the sacrificial material bodies. Other factors which may be advantageously varied include provision of chromium coatings on the sacrificial material bodies of a thickness proportional to etch time to increase chromium thickness, variation of the relative surface areas of chromium and copper exposed, variation of the etching power during chromium redeposition or resputtering, enhancing redeposition by system geometry and/or system electrical potentials and variation of inert gas pressure to alter the mean free path of etched species to alter redeposition rate.

The surface of the polymer is activated by brief, low energy etching, as described above, in etch chamber 620. This low energy etching does not necessarily develop a significant thickness of deposited metal on the polymer but achieves the creation of chemical bonding as a possibly discontinuous interfacial adhesion layer at the chromium/polymer interface as well as an improved microstructure at the interface between the metal and the polymer. The substrates and bodies of sacrificial material are then moved to the deposition chamber 630 where temperatures are increased. At this etching power density, preferably on the order of 0.4 Watts/cm$^2$, the substrates, tooling, such as discrete bodies of sacrificial material, and fixture coating are etched and activated species are added to the argon atmosphere and circulated through the chamber. Some of these activated metal species will be resputtered and redeposited on the polymer substrate. These species may also form Cr—O—C bonds with the polymer. It is to be noted that the likelihood of such a reaction is favored both by the temperature at which this process is carried out and, perhaps more significantly, by the activation of the polymer surface. The etching power level is preferably adjusted such that any redeposited chromium species, for example, which do not form such bonds are etched away from the polymer. Also at this increased power level, the surface of the polymer becomes roughened. This surface roughening further enhances adhesion by increasing surface area and enhancing the embedding of deposited metal within the surface of the polymer.

Figure 7:
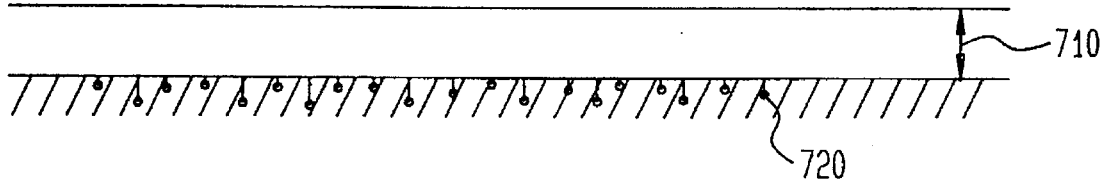
FIG. 7 is a cross-sectional view of a preferred metallization layer in accordance with the invention.

It has also been found during the course of this process that adhesion of the metallization layer thus formed will be maximized for a particular range of concentrations of copper in the deposited mixture of metals including chromium. This concentration in the mixture can be monitored optically through one or more viewing ports 631 using Optical Emission Spectroscopy (OES) techniques (indicated at 632), which are, per se, well-known. Essentially, for purposes of practice of this invention, the relative amounts of both copper and chromium species will be deposited in approximately the concentrations present in the plasma atmosphere of the chamber. These relative concentrations can be determined by observation of the magnitudes of characteristic peaks of the emission spectrum of the plasma. Specifically, observations are made, for these materials, at wavelengths of 404 nm for Argon, 357 nm for chromium and 323 nm for copper. The relative concentrations of copper and chromium can be affected by the etching power density since higher power density yields a higher etch rate for chromium, particularly of the top chromium coat and faster etching of the chromium yields more copper underneath the chromium film, and, to a lesser extent by the pressure of argon gas. The relative concentrations of copper and chromium can be altered by forming differently composed layers in the bodies of sacrificial material to enhance the control of concentrations by etching power density. Preferably, the Argon pressure is maintained at $3\times10^{-3}$ Torr $\pm12\%$ and the bodies or fixtures provided as a mixture of chromium and copper with an outer coating of chromium approximately 260 Å thick. Therefore, the initial concentration of chromium in the process atmosphere will rapidly increase before copper concentrations become significant. The relative concentrations of copper and chromium are then used to determine the endpoint of the redeposition process. A ratio of chromium to copper of 1:1 has been found to be a practical working value and corresponds to a final metallization layer thickness of about 50 Å, and may be embedded in the polyimide to form clusters 720 as illustrated in FIG. 7. In practice, this endpoint was reached in a mean time of 245.5 seconds ($\sigma=14.1$ seconds) under the above conditions of argon pressure and a power density of 0.4 W/cm$^2$.

As an example of a preferred form of the process in accordance with the invention, bodies of sacrificial material or coated devices (e.g. fixtures) were prepared primarily comprising copper or a chromium/copper mixture overlaid with a layer of chromium of 300 Å thickness. RF etching was conducted for 300 seconds at a power density of 0.4 W/cm$^2$, applied through electrodes 634, while the magnitude of the optical spectra of chromium, copper and argon were monitored in bands corresponding to the above wavelengths. The magnitude of the radiation at wavelengths corresponding to argon immediately peaked, as would be expected before substantial etching had taken place, and subsequently declined to a substantially constant value as metal species were added to the plasma. The magnitude of the radiation at wavelengths corresponding to chromium peaked at about 70 seconds into the etching process as the chromium layer on the bodies or devices was etched away to expose copper. The chromium concentration then declined monotonically as copper species were added to the plasma. The magnitude of the radiation at wavelengths corresponding to copper increased monotonically after a rapid initial increase, corresponding to the etching away of "native oxides" of copper, to about one-third of the final value as more pure copper was exposed to the etching process and the ratio of chromium and copper approached a value of 1:1 at the end of the 300 second etching period. Thickness of the metallization may be controlled by adjustment of the etch/redeposition process time such as by providing a thicker chromium layer on the fixtures or bodies of sacrificial material or altering the power density of the etch or both. Alternatively, other metal deposition processes could be employed after the initial etch/redeposition process which is effective to form initial metallization with improved adhesion at the metal/substrate interface in accordance with the invention. Once this metallization is formed as an interfacial adhesion layer which may be either continuous or discontinuous at the interface of the polymer substrate and the chromium layer 310, any further desired metallization layers in a desired conductor structure can be formed by known methods.

FIG. 7 also depicts the structure, observed through transmission electron microscopy, of the clusters 720 of chromium and copper which are formed embedded within the surface of the polymer by the process of the invention but contiguous with the deposited metal film 710. These clusters physically anchor the metallization to the substrate by being embedded within the substrate. This anchoring function is further enhanced by the chemical bond which increases the mechanical integrity of this formation at the metal/substrate interface.

Figure 8:
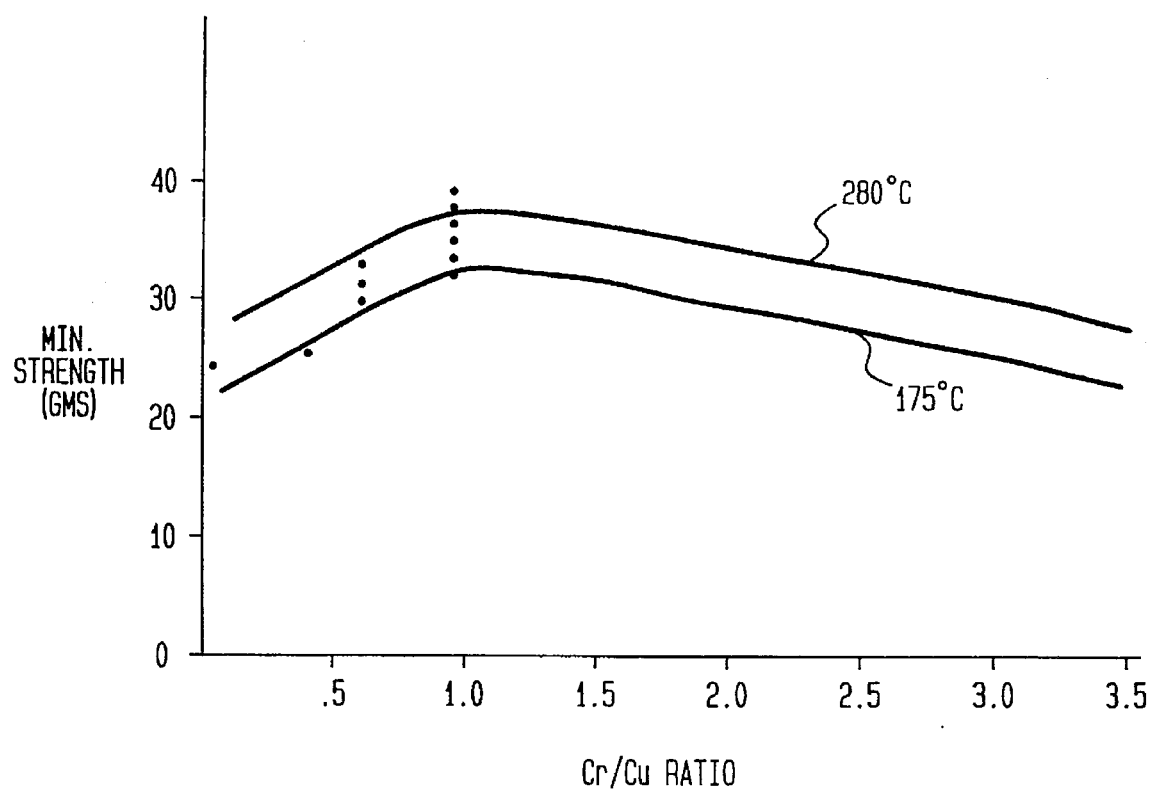
FIG. 8 is a graph showing adhesion strength for different final ratios of chromium and copper deposited on a polymer substrate at different temperatures in accordance with the invention.

FIG. 8 shows the strength of bonding obtained using a simultaneous etch and deposition process (sometimes referred to as a "sputter clean" process) as a function of final ratio of chromium to copper. The resulting curve of bonding strength shows a broad peak at Cr:Cu ratios between approximately 0.3 and 3.0, from which the above working number was derived. A working number of 1.0 thus maximizes bonding strength without significantly weakening the bond, which appears to occur as the higher power etch/redeposition process progresses.

A redeposited mixture having a Cr:Cu ratio of about 1.0 can be obtained by using bodies of sacrificial material having a Cr:Cu ratio which also approximates 1.0 since the chromium coating of the sacrificial material provides additional chromium. The Cr:Cu ratio in the sacrificial material need not be exact since the sputter etch rate of chromium is about one-half that of copper in an ionized argon atmosphere at a sputter energy of about 600 eV. However, if the mixture of chromium and copper in the sacrificial material is approximately 1:1, etching of copper will have the effect of significantly increasing the surface density of chromium on the bodies of sacrificial material and lead to an equilibrium condition where the deposited ratio will remain approximately 1:1 regardless of the fact that the copper is preferentially etched under given conditions. On the other hand, however, widely differing concentrations (e.g. more than about twice the differential in etch rate) in the sacrificial material) will result in a ratio of deposited materials which does reflect the relative etching rates. For example, a Cr:Cu ratio of 10:1 in the sacrificial material would result in a Cr:Cu deposition ratio of about 5:1. The Cr:Cu ratio in the redeposited film may also be adjusted somewhat by varying the RF power and, thus, the impingement density of the respective ions. The respective impingement densities may also be adjusted by varying the gases and pressures thereof, etch times and other factors, as discussed above. These variations are also applicable to alternative processes discussed above such as plasma etching and ion milling which can also be used in the practice of the invention.

As a variation of the process of the invention suitable for a production manufacturing process, it is also possible to sputter material from bodies of sacrificial material or sputtering targets onto tooling, fixtures or other devices as a mixture of chromium and copper having a Cr:Cu ratio of 1.0 or other desired working value. This sputtering process is relatively non-critical except for the Cr:Cu ratio and may be done in a relatively large batch. Then, in accordance with the invention, the mixture of chromium and copper is again etched from the fixtures or other devices and redeposited on the substrates. The advantage of this process is that the Cr:Cu ratio is fixed and invariant during the etch/redeposition process.

Also shown in FIG. 8 is the enhancement obtained through the use of higher deposition temperature. The curves shown in FIG. 8 reflect the process according to the invention carried out at temperatures of 175° C. and 280° C., respectively. The peak of the higher temperature process curve occurs at the same Cr:Cu ratio as that for the lower temperature process but represents an increase in adhesion strength of about 15%. More importantly, if an adhesion strength of 27 grams, as measured in the above-described pull test, is used as a benchmark for reliable product, the entire high temperature curve is seen to lie well above this adhesion value for final Cr:Cu ratios from 0.3:1 to 3.0:1 indicating substantial latitude in the process according to the invention which will produce good yield of reliable product.

It should also be noted from FIG. 8 that the optimum final Cr:Cu ratio is 1:1 for MetaPaete (an acronym for Meta-Poly Amic-acid EThyl Ester, manufactured for the assignee of this application by E. I. DuPont Co.,) polymer but may be somewhat different for other polymers such as PI-5811 (BPDA-PDA) or PI 5878 (BPDA-ODA). Nevertheless, the latitude of the process and the monotonic and broadly peaked characteristic curve will allow the process to be successfully carried out as described and the Cr:Cu ratio then optimized for any given polymer based on empirical data which can be obtained from a small number of iterations of the process at different ratios and corresponding pull tests of the resulting metal/polymer adhesion.

Figure 9:
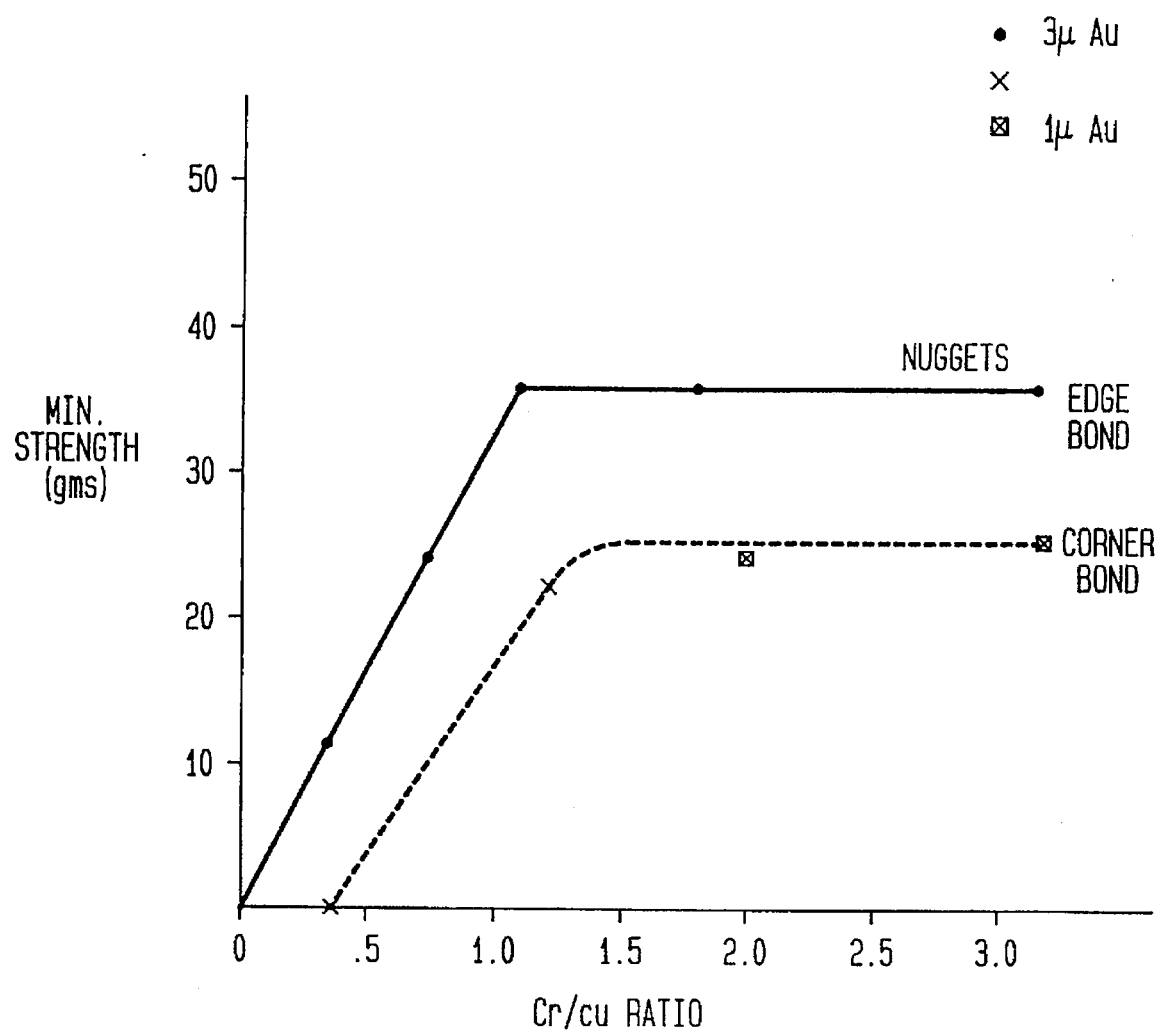
FIG. 9 is a graph showing adhesion strength for different final ratios of chromium and copper deposited on a glass/ceramic substrate in accordance with the invention.

It has also been found by the inventors that the process according to the invention is applicable to provide improved adhesion to glass or ceramic substrates. FIG. 9 shows the results of wire pull tests using the configuration of FIG. 3 under a variety of conditions. The different curves correspond to different locations of the bond on the pad. The illustrated data shows that thin (e.g. 200 Å) chromium precoating actually reduces adhesion of coatings produced by the simultaneous etch/deposition process and that the control process conditions of 0.4 Watts/cm$^2$ for a process time of four minutes to a final chromium to copper ratio of 2:1 is near the center of the optimal range (e.g. the horizontal portion of the curves indicating breakage of the test wire) for metal adhesion to glass or ceramic substrates. Generally speaking, optimum metal to substrate adhesion requires a higher Cr:Cu ratio for glass/ceramic substrates than for polymer substrates. Specifically, as shown in FIG. 7, the working range for the Cr:Cu ratio was in the range of 0.3:1 to 3.0:1 with an optimum ratio of approximately 1.0, whereas for glass/ceramic substrates such as cordierite-forming glass which crystallizes upon sintering to form cordierite, the preferred working range is from about 1.25:1 to 3.0:1 with an optimum ratio of about 2.5:1 as shown in FIG. 9.

From the above, it is seen that the process including bake-out of moisture and activation of the polymer surface and the apparatus by which it is conducted provides substantial increase in adhesion between metallization and a polymer, particularly if particular temperatures and etching power densities are observed during bake-out, polymer surface activation and metal deposition. The structure of a redeposited metal mixture provides simplicity of process steps, fine detail of patterning and further enhanced adhesion to both polymer and glass/ceramic substrates. As indicated above, the process according to the invention will provide improved adhesion between a deposited metal and a polymer, glass or ceramic material, regardless of application or the structure ultimately formed. For example, the invention is also particularly applicable to the formation of mounting or attachment surfaces for the assembly of metal connection pins to the bottom side metallurgy of multi-layer circuit modules.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An electronic circuit module including a metallization layer formed on an exterior surface of said electronic circuit module, said metallization layer of metal containing a mixture of chromium and copper in a ratio in a range of 0.3:1 to 3.0:1 including clusters of said metal embedded within said electronic circuit module adjacent said exterior surface.

2. An electronic circuit module as recited in claim 1, wherein said metallization layer forms a pad.

3. An electronic circuit module as recited in claim 1, wherein said metallization layer forms a mounting surface for a connection pin.

* * * * *